United States Patent
Kwan et al.

(10) Patent No.: US 9,627,275 B1
(45) Date of Patent: Apr. 18, 2017

(54) HYBRID SEMICONDUCTOR STRUCTURE ON A COMMON SUBSTRATE

(71) Applicant: TAIWAN SEMICONDUCTOR MANUFACTURING COMPANY LTD., Hsinchu (TW)

(72) Inventors: Man-Ho Kwan, Kowloon (HK); Fu-Wei Yao, Hsinchu (TW); Ru-Yi Su, Yunlin County (TW); Chun Lin Tsai, Hsin-Chu (TW); Alexander Kalnitsky, San Francisco, CA (US)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/928,623

(22) Filed: Oct. 30, 2015

(51) Int. Cl.
| | | |
|---|---|---|
| H01L 23/00 | (2006.01) | |
| H01L 27/06 | (2006.01) | |
| H01L 29/06 | (2006.01) | |
| H01L 29/16 | (2006.01) | |
| H01L 29/20 | (2006.01) | |
| H01L 21/8258 | (2006.01) | |
| H01L 21/768 | (2006.01) | |

(Continued)

(52) U.S. Cl.
CPC ...... *H01L 21/8258* (2013.01); *H01L 21/0254* (2013.01); *H01L 21/02381* (2013.01); *H01L 21/02543* (2013.01); *H01L 21/02546* (2013.01); *H01L 21/02549* (2013.01); *H01L 21/26546* (2013.01); *H01L 21/761* (2013.01); *H01L 21/76898* (2013.01); *H01L 23/535* (2013.01); *H01L 27/0605* (2013.01); *H01L 27/0688* (2013.01); *H01L 29/0646* (2013.01); *H01L 29/16* (2013.01); *H01L 29/205* (2013.01)

(58) Field of Classification Search
CPC ............... H01L 23/535; H01L 27/0605; H01L 27/0688; H01L 29/0646; H01L 29/16; H01L 29/205

See application file for complete search history.

(56) References Cited

U.S. PATENT DOCUMENTS 6,054,371 A * 4/2000 Tsuchiaki ............ H01L 21/6835
257/E27.097
6,229,179 B1 * 5/2001 Song .................. H01L 21/76264
257/329

(Continued)

FOREIGN PATENT DOCUMENTS

DE 102014111653 2/2015
KR 10-2015-0063683 6/2015

OTHER PUBLICATIONS

Office Action issued on Aug. 4, 2016 for the Germany counterpart application 10 2016 100 016.7.

(Continued)

*Primary Examiner* — Ida M Soward
(74) *Attorney, Agent, or Firm* — WPAT, P.C., Intellectual Property Attorneys; Anthony King (57) ABSTRACT

A semiconductor structure includes a first device and a second device. The first device has a first surface. The first device includes a first active region defined by a first material system. The second device has a second surface. The second surface is coplanar with the first surface. The second device includes a second active region defined by a second material system. The second material system is different from the first material system.

19 Claims, 12 Drawing Sheets

(51) Int. Cl.
  *H01L 21/02*   (2006.01)
  *H01L 29/205*  (2006.01)
  *H01L 21/265*  (2006.01)
  *H01L 21/761*  (2006.01)
  *H01L 23/535*  (2006.01)

(56) References Cited

U.S. PATENT DOCUMENTS

| | | | | |
|---|---|---|---|---|
| 6,420,730 B1* | 7/2002 | Gardner | ............ | H01L 21/8221 257/67 |
| 6,881,621 B2* | 4/2005 | Choe | ................. | H01L 21/6835 257/E21.538 |
| 8,835,988 B2* | 9/2014 | Marino | ............. | H01L 21/02381 257/200 |
| 2003/0010998 A1* | 1/2003 | Callaway, Jr. | ...... | H01L 21/8258 257/190 |
| 2003/0234401 A1* | 12/2003 | Fonstad, Jr. | ........ | H01L 21/2007 257/84 |
| 2006/0261410 A1* | 11/2006 | Ohguro | ................. | H01L 21/84 257/350 |
| 2009/0050939 A1 | 2/2009 | Briere | | |
| 2009/0242893 A1* | 10/2009 | Tomiyasu | ........... | G02F 1/13454 257/72 |
| 2010/0301396 A1 | 12/2010 | Briere | | |
| 2013/0270551 A1* | 10/2013 | Yoneda | ............... | H01L 27/0605 257/43 |
| 2014/0091398 A1* | 4/2014 | Hata | ................... | H01L 21/8258 257/369 |
| 2014/0191252 A1* | 7/2014 | Lee | ....................... | H01L 27/092 257/79 |
| 2015/0014740 A1 | 1/2015 | Briere | | |
| 2015/0044859 A1* | 2/2015 | Cheng | .................. | H01L 27/088 438/478 |
| 2015/0137139 A1* | 5/2015 | Hirler | ................ | H01L 21/8258 257/76 |
| 2016/0372555 A1 | 12/2016 | Twynam | | |

OTHER PUBLICATIONS

Office Action issued on Feb. 9, 2017 for the Korea counterpart application 10-2016-0013826.
US20160372555 corresponds to KR20150063683 Jun. 10, 2015.

* cited by examiner

HYBRID SEMICONDUCTOR STRUCTURE ON A COMMON SUBSTRATE

BACKGROUND

Recently, the development of power electronic devices such as switches or rectifiers highlights manufacturing of power devices. Typically, power devices are made of III-V material. By means of semiconductor manufacturing, power devices are able to be integrated into an integrated circuit or a chip. In this way, power devices have more compact size and versatility.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
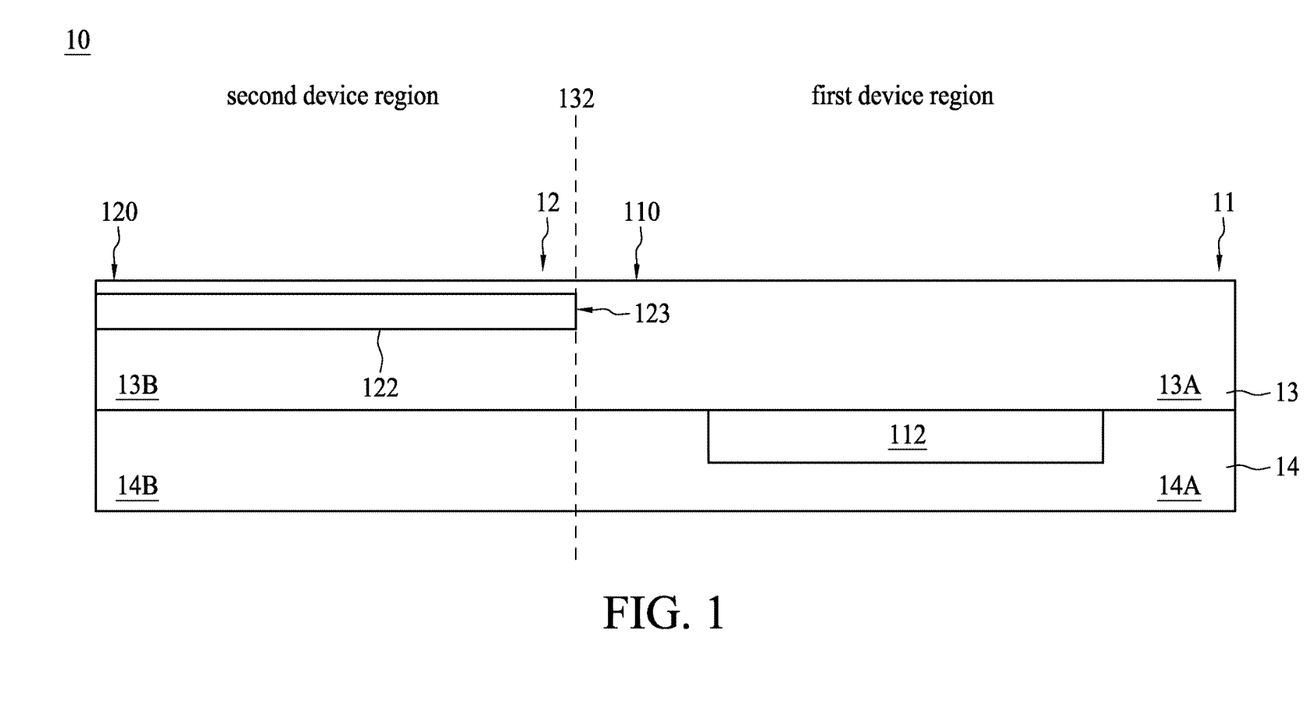
FIG. 1 is a diagram of a semiconductor structure, in accordance with some embodiments of the present disclosure.

FIG. 1 is a diagram of a semiconductor structure 10, in accordance with some embodiments of the present disclosure. Referring to FIG. 1, the semiconductor structure 10 includes a first device 11 and a second device 12. The first device 11 and the second device 12 have a first surface 110 and a second surface 120, respectively. The first surface 110 is co-planar with the second surface 120.

In some embodiments, the first device 11 is a Si active device, such as transistors, diodes, photo-diodes, fuses, resistors, capacitors, etc. For example, the transistors include metal-oxide-semiconductor (MOS) transistors, bipolar junction transistors (BJTs), complementary MOS (CMOS) transistors, etc. Moreover, the first device 11 may include logic device, memory device (for example, a static random access memory (SRAM)), radio frequency (RF) device, input/output (I/O) device, system-on-chip (SoC) device, other suitable types of devices, or combinations thereof.

In some embodiments, the second device 12 is high-voltage devices or power devices, which are commonly used as switches or rectifiers in power electronic circuits or in integrated circuits. For example, some common power devices are the power diode, thyristor, power metal-oxide-semiconductor field-effect transistor (MOSFET), bipolar junction transistor (BJT) and insulated gate bipolar transistor (IGBT). A power diode or MOSFET operates on similar principles to its low-power counterpart, but is able to carry a larger amount of current and typically is able to support a larger reverse-bias voltage in the off-state.

The first device 11 includes a first active region 112. The first active region 112 is located in a first device region 14A of a substrate 14. The first device region 14A is a portion of the substrate 14 associated with the first device 11. The substrate 14 and the first active region 112 are made of a first material system. In some embodiments, the substrate 14 and the first active region 112 are made of silicon. Moreover, the first device 11 includes a first region 13A of a layer 13 over the first device region 14A. The layer 13 is made of a second material system different from the first material system. For example, the layer 13 is made of III-V material, which may be gallium arsenide, indium arsenide, indium gallium arsenide, indium phosphide, gallium nitride, indium antimonide, gallium antimonide, gallium phosphide, and/or any ternary or quaternary compounds thereof or mixtures or alloys thereof.

In some embodiments, the substrate 14 includes silicon germanium, gallium arsenic, silicon carbon, or other suitable semiconductor materials. In some embodiments, the substrate 14 further includes doped regions such as a P-well and/or an N-well (not shown). In some other embodiments, the substrate 14 further includes other features such as a buried layer, and/or an epitaxy layer. Furthermore, in some embodiments, the substrate 14 is semiconductor on insulator such as silicon on insulator (SOI). In other embodiments, the semiconductor substrate 14 includes a doped epi layer, a gradient semiconductor layer, and/or further includes a semiconductor layer overlying another semiconductor layer of a different type such as a silicon layer on a silicon germanium layer. In some other examples, a compound semiconductor substrate includes a multilayer silicon structure or a silicon substrate may include a multilayer compound semiconductor structure. In some embodiments, the substrate 14 may include other elementary semiconductors such as germanium and diamond. In some embodiments, the substrate 14 includes a compound semiconductor such as, silicon carbide, gallium arsenide, indium arsenide, or indium phosphide.

Similarly, the second device 12 includes a second active region 122 in a second region 13B of the layer 13. The second active region 122 is composed of second material system. In some embodiments, the second active region 122 is not overlapping with the first active region 112 in the first device region 14A. The second active region 122 has a side 123 indicated by a dotted line 132. The side 123 of the second active region 122 acts as a border between the first device 11 and the second device 12. Moreover, the second device 12 further includes a second device region 14B of the substrate 14. The second device region 14B of the substrate 14 is associated with the second device 12. The second device region 14B is below the second active region 122.

In some embodiments, the first surface 110 and the second surface 120 form a coplanar surface which is the surface of the layer 13. That is, there is substantially no step difference between the first surface 110 and the second surface 120. In the present embodiment, the first device 11 and the second device 12 are immediately adjacent to each other. The semiconductor structure 10 becomes more compact, and therefore the semiconductor structure 10 has relatively low area cost. Moreover, the first device 11 and the second device 12 are integrated without undergoing any bonding operation. In addition, no step difference between the first surface 110 and the second surface 120 further facilitates the subsequent metallization operations where the quality of the photolithography is highly depending on the height uniformity of the projected surface.

In some existing semiconductor structures integrating III-V material system and Si material system, the two material systems are connected by a bonding operation, for example, the Si material system stacks on the III-V material system. The bonding operation leads to relative high cost. Moreover, due to the bonding operation, there is typically a step difference between a surface of the III-V material system and a surface of the Si material system. The region in proximity to the step difference cannot be implemented with any active device and thus a predetermined device region is wasted. Accordingly, such semiconductor structure having a step difference between integrated devices consume more area, and therefore have relatively high area cost.

Figure 2:
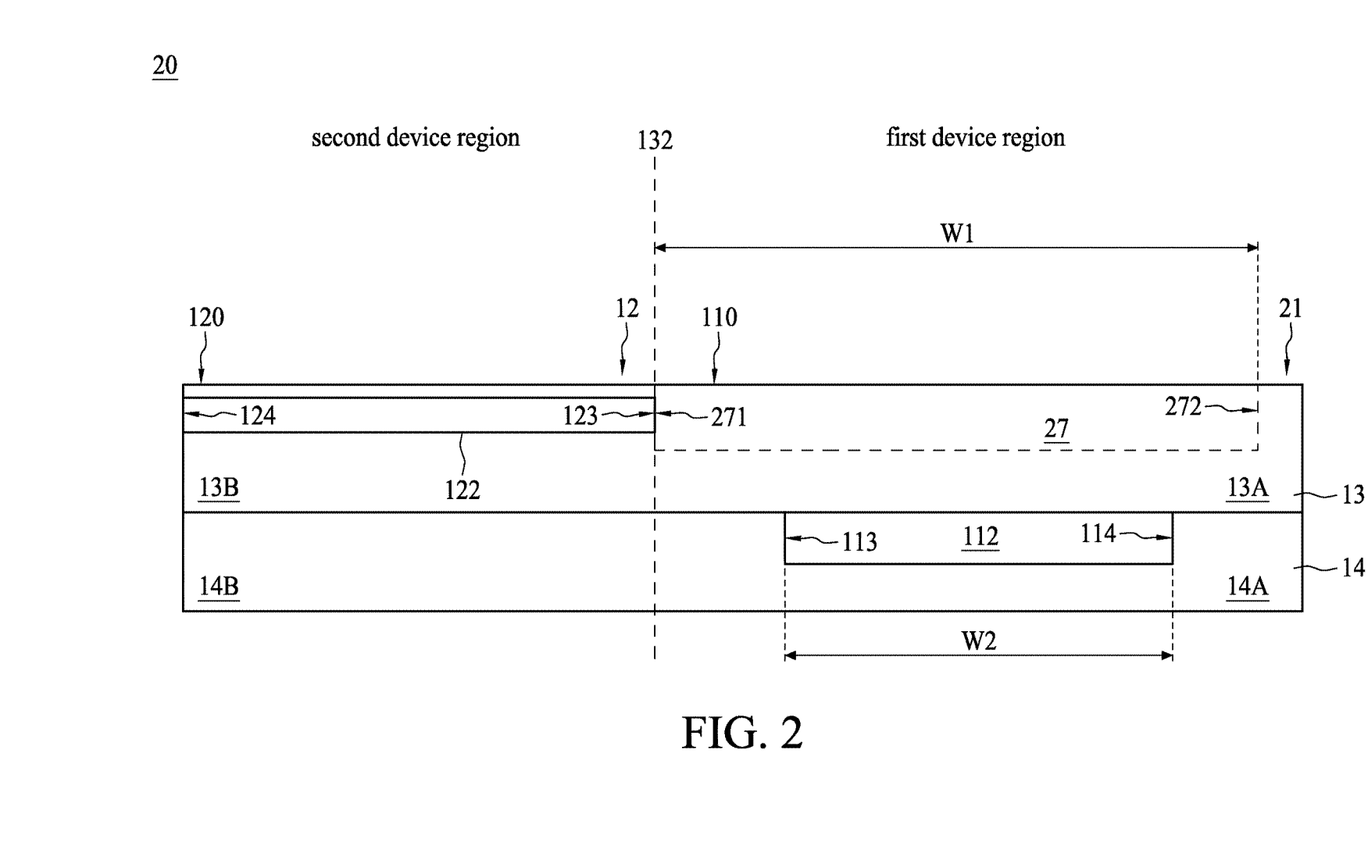
FIG. 2 is a diagram of a semiconductor structure, in accordance with some embodiments of the present disclosure.

FIG. 2 is a diagram of a semiconductor structure 20, in accordance with some embodiments of the present disclosure. Referring to FIG. 2, the semiconductor structure 20 is similar to the semiconductor structure 10 described and illustrated with reference to FIG. 1 except that the semiconductor structure 20 includes an isolation region 27 in the first device 21.

The isolation region 27 is in the first region 13A of the layer 13 of the second material system and over the first active region 112. The isolation region 27 is configured to repel carriers of the second active region 122 from entering the first region 13A of the layer 13 in the first device 21. The isolation region 27 has a first side 271 and a second side 272 opposite to the first side 271. The first side 271 overlaps with the side 123 of the second active region 122, and is used to determine the border between the first device 11 and the second device 12. If the first side 271 of the isolation region 27 extends toward a side 124 of the second active region 122, the scale of the second device 12 decreases and the scale of the first device 11 increases, and vice versa.

Moreover, the first active region 112 has a first side 113 and a second side 114 opposite to the first side 113. In the present embodiments, a first distance W1 between the first side 271 and the second side 272 of the isolation region 27 is greater than a second distance W2 between the first side 113 and the second side 114 of the first active region 112. In some embodiments, difference between the first distance W1 and the second distance W2 is less than 10 μm.

For similar reasons as provided in the embodiment of FIG. 1, since the first surface 110 of the first device 21 is coplanar with the second surface 120 of the second device 12, the area cost relatively low and manufacturing of the semiconductor structure 20 becomes simpler due to no requirement of the bonding operation.

Figure 3:
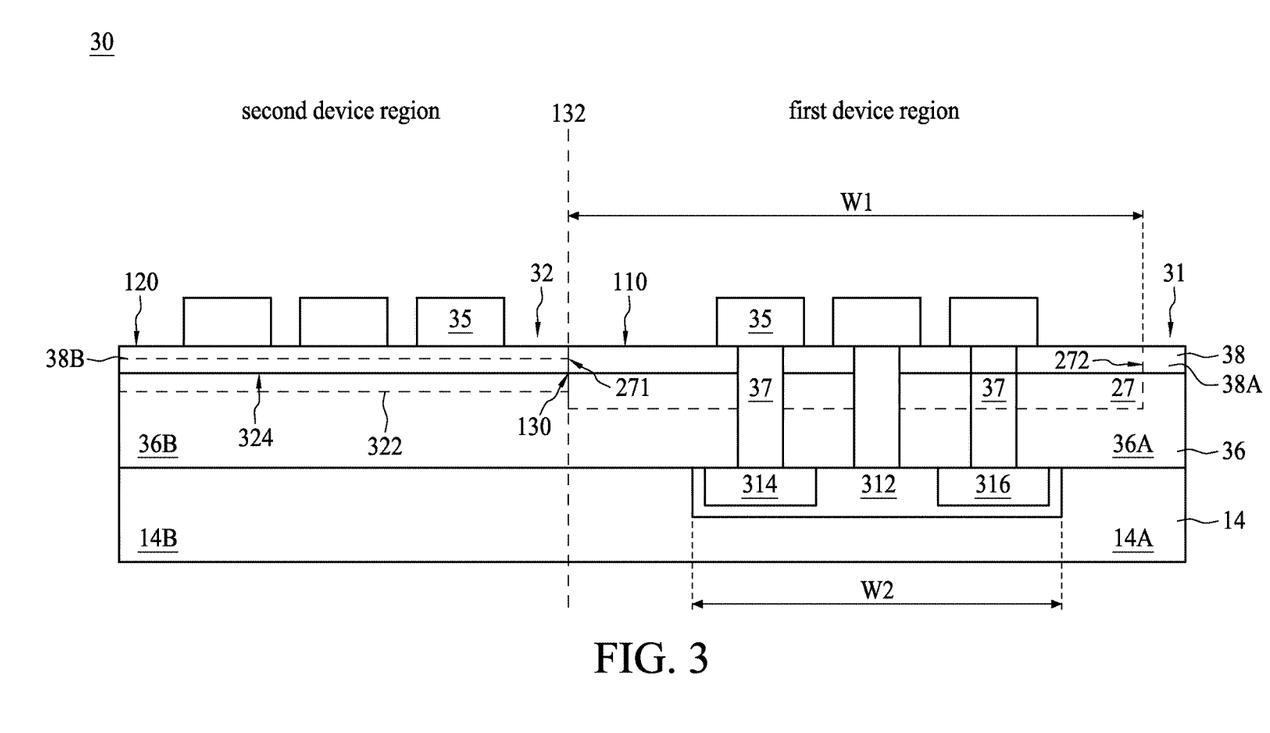
FIG. 3 is a cross section of a semiconductor structure, in accordance with some embodiments of the present disclosure.

FIG. 3 is a cross section of a semiconductor structure 30, in accordance with some embodiments of the present disclosure. Referring to FIG. 3, the semiconductor structure 30 is similar to the semiconductor structure 20 described and illustrated with reference to FIG. 2 except that the semiconductor structure 30 includes more details of a first device 31 and a second device 32.

The first device 31 and the second device 32 are similar to the first device 21 and the second device 12, respectively, described and illustrated with reference to FIG. 2 except that the first device 31 includes a first active region 312 with two doped regions 314 and 316 therein, the second device 32 includes a second active region 322, and the first device 31 and the second device 32 include a layer of the second material system. The second material system has a first bandgap layer 36 and a second bandgap layer 38.

The first active region 312 and two doped regions 314 and 316 define an active device, such as a transistor. For example, the active region 312 is doped with a dopant of p-type and the doped regions 314 and 316 are doped with a dopant of n-type. In such a manner, the first active region 312 and the doped regions 314 and 316 define n-type semiconductor devices, such as n-channel metal-oxide-semiconductor field effect transistors (MOSFETs). Alternatively, for example, the first active region 312 is doped with a dopant of n-type and the doped regions 314 and 316 are doped with a dopant of p-type. In such a manner, the first active region 312 and the doped regions 314 and 316 define p-type semiconductor devices, such as p-channel metal-oxide-semiconductor field effect transistors (MOSFETs). The active device is communicatively coupled to another device via an interconnect 37 and a patterned conductive layer 35 on the second bandgap layer 38 of the second material system. For example, the interconnect 37 is a thorough-GaN-Via (TGV), and the patterned conductive layer 35 is a first metal layer after the front end operations. The interconnect 37 penetrates through the layer including the first bandgap layer 36 and the second bandgap layer 38, and is configured to connect the patterned conductive layer 35 at one end and the first active region 312 at the other end.

The first bandgap layer 36 and the second bandgap layer 38 are made of the second material system. In some embodiments, second bandgap is greater than the first bandgap. In the present embodiment, the first bandgap layer 36 is GaN and the second bandgap layer 38 is AlGaN while the disclosure is not limited thereto. The first bandgap layer 36 and the second bandgap layer 38 may be gallium arsenide, indium arsenide, indium gallium arsenide, indium phosphide, gallium nitride, indium antimonide, gallium antimonide, gallium phosphide, and/or any ternary or quaternary compounds thereof or mixtures or alloys thereof.

Moreover, the first device 31 includes a first portion 36A of the first bandgap layer 36 and a first portion 38A of the second bandgap layer 38. The first portion 36A and the first portion 38A are associated with the first device 31. The first portion 36A of the first bandgap layer 36 is on the first device region 14A of the substrate 14. The first portion 38A of the second bandgap layer 38 is on the first portion 36A of the first bandgap layer 36.

The isolation region 27 is over the first device region 14A and across an interface between the first portion 36A of the first bandgap layer 36 and the second portion 38A of the second bandgap layer 38. In this way, for similar reasons as provided in the embodiment of FIG. 2, two-dimensional electron gas (2-DEG) generated in the second device 32 does not flow into any portion of the first device 31 due to negatively-charged ions repelling electrons coming from the second active region 322 of the second device 32.

On the other hand, the second device 32 includes a second portion 36B of the first bandgap layer 36 and a second portion 38B of the second bandgap layer 38. The second portion 36B and the second portion 38B are associated with the second device 32. The second portion 36B of the first bandgap layer 36 is on the second device region 14B of the substrate 14. The second portion 38B of the second bandgap layer 38 is on the second portion 36B of the first bandgap layer 36.

The second active region 322 is defined by the first bandgap layer 36 and the second bandgap layer 38. Since bandgap of the second bandgap layer 38 is greater than that of the first bandgap layer 36, a band gap discontinuity exists between the first bandgap layer 36 and the second bandgap layer 38. The electrons from a piezoelectric effect in the second bandgap layer 38 drop into the first bandgap layer 36, resulting in a very thin layer (i.e. the second active region 322) of highly mobile conducting electrons in the first bandgap layer 36. The thin layer of 2-DEG is located at the interface between the first bandgap layer 36 and the second bandgap layer 38. Thus, the carrier channel has high electron mobility because the first bandgap layer 36 is un-doped or unintentionally doped, and the electrons can move freely without collision or substantially reduced collision with the impurities. It is noted that for clarity of illustration, dimension of the second active region 322 is exaggerated.

For communication with another device, such as the active device of the first device 31, there is also the conductive patterned layer 35 on the second portion 38B of the second bandgap layer 38, and that conducted patterned layer 35 is coupled to the second active region 322, and further coupled to drain, gate and source of a transistor if the second portion 36B of the second bandgap layer 36 and the second portion 38B of the second bandgap layer 38 define transistors.

In the present embodiment, the first surface 110 and the second surface 120 are a surface of the second bandgap layer 38. Therefore, the first surface 110 is coplanar with the second surface 120. For similar reasons as provided in the embodiment of FIG. 1, since the first surface 110 of the first device 31 is coplanar with the second surface 120 of the second device 32, the cost per area is relatively low and manufacturing of the semiconductor structure 30 becomes simpler due to no requirement of the bonding operation.

Figure 4:
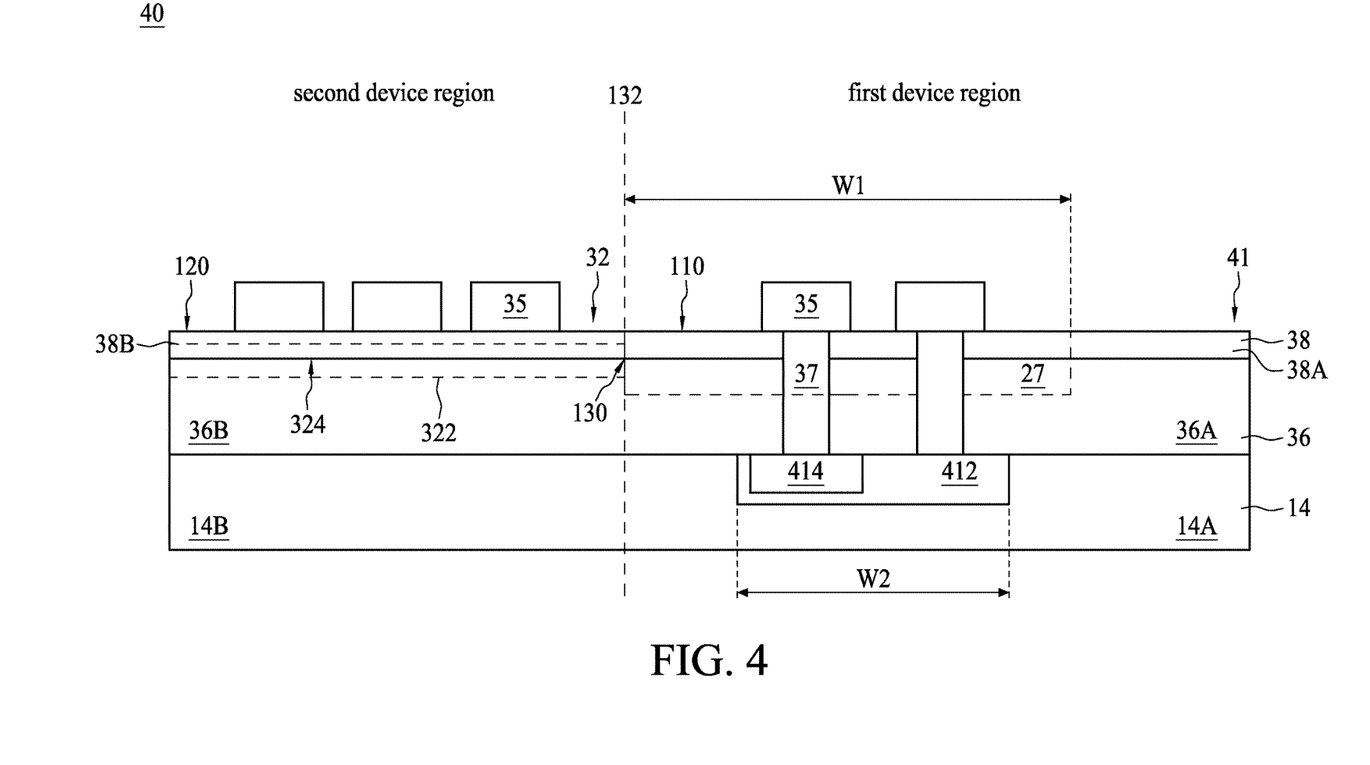
FIG. 4 is a diagram of a semiconductor structure, in accordance with some embodiments of the present disclosure.

FIG. 4 is a cross section of a semiconductor structure 40, in accordance with some embodiments of the present disclosure. Referring to FIG. 4, the semiconductor structure 40 is similar to the semiconductor structure 30 described and illustrated with reference to FIG. 3 except that the semiconductor structure 40 includes a different first device 41.

The first device 41 is similar to the first device 31 described and illustrated with reference to FIG. 3 except that the first device 41 includes a first active region 412 with a doped region 414 in the first device region 14A of the substrate 14. The first active region 412 and the doped region 414 define a zener diode (or a rectifier). The doped region 414 serves as an anode of the zener diode and the first active region servers as a cathode of the zener diode. The interconnect 37 penetrates through the first bandgap layer 36 and the second bandgap layer 38, and is configured to connect the doped region 414 and the first active region 412 at one end and the patterned conductive layer 35 at the other end.

For similar reasons as provided in the embodiment of FIG. 1, since the first surface 110 of the first device 41 is coplanar with the second surface 120 of the second device 32, the cost per area is relatively low and manufacturing of the semiconductor structure 40 becomes simpler due to no requirement of the bonding operation.

Figure 5A:
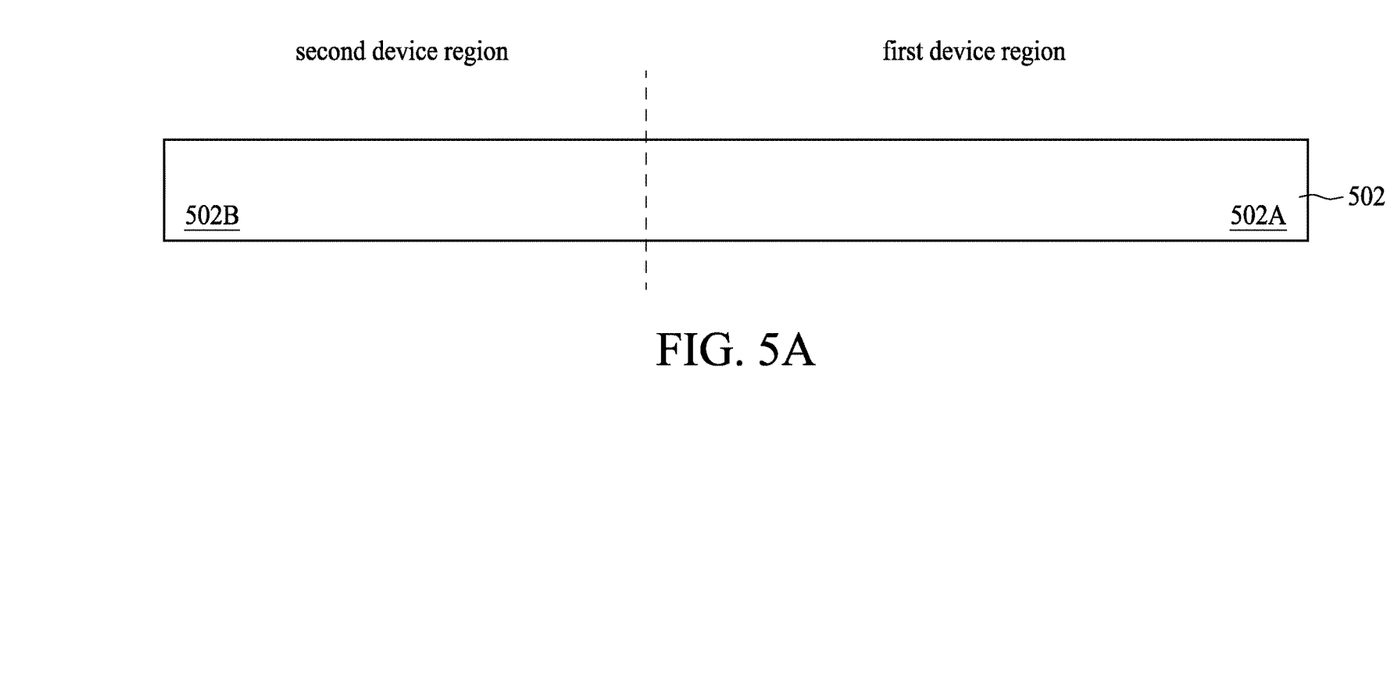
FIGS. 5A to 5G are diagrams showing a method of manufacturing a semiconductor device, in accordance with some embodiments of the present disclosure.

FIGS. 5A to 5G are diagrams showing a method of manufacturing a semiconductor structure, in accordance with some embodiments. Referring to FIG. 5A, a substrate 502 is provided. The substrate 502 includes a first device region 502A and a second device region 502B. The first device region 502A and the second device region 502B are associated with a first device and a second device of the semiconductor structure, respectively. In some embodiments, the substrate 502 includes a p-type substrate.

Figure 5B:
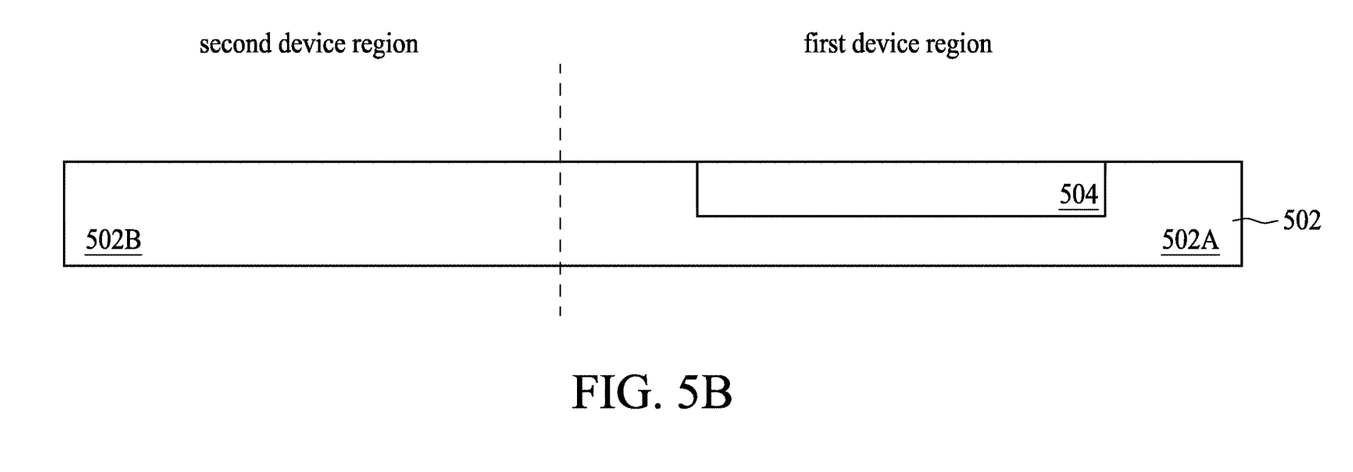

Referring to FIG. 5B, a first active region 504 is formed in the substrate 502 by, for example, an ion implantation operation. In some embodiments, the first active region 504 is doped with a dopant of n-type. In other embodiments, the first active region 504 is doped with a dopant of p-type.

Figure 5C:
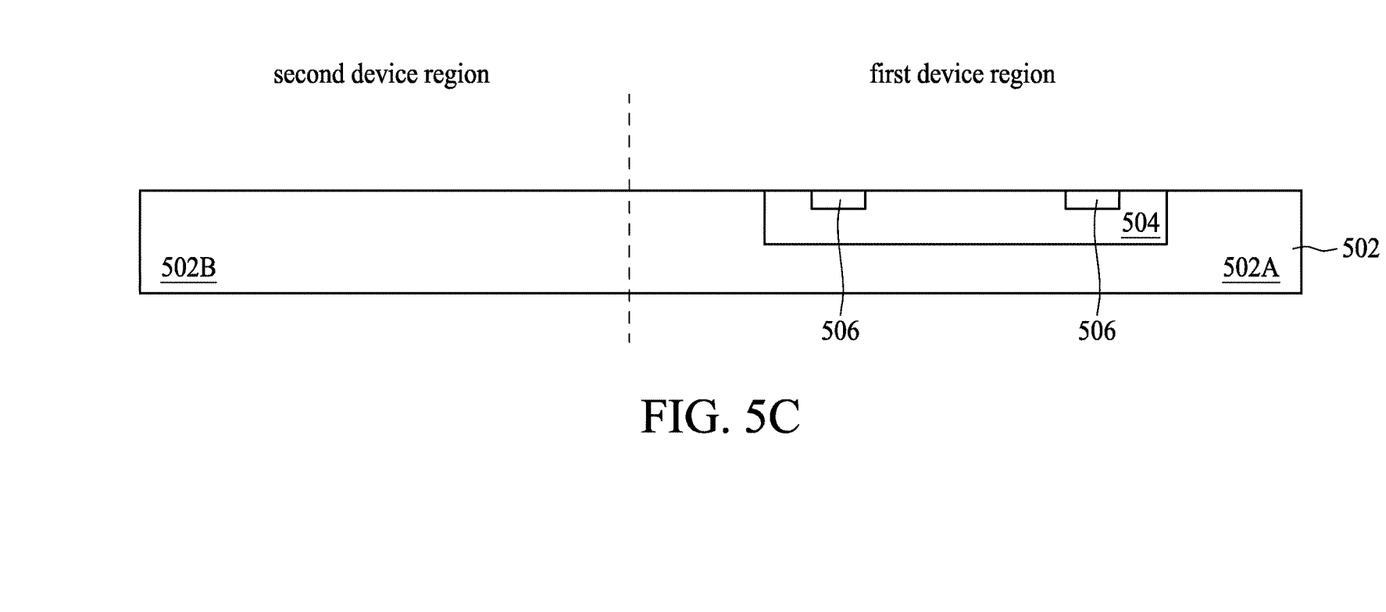

Referring to FIG. 5C, doped regions 506 are formed in the first active region 504 by, for example, an ion implantation operation followed by an annealing operation. In some embodiments, the doped regions 506 are doped with a dopant of n-type. In other embodiments, the doped regions 506 are doped with a dopant of p-type. With the first active region 504 of n-type dopant and the doped regions 506 of p-type dopant, a PMOS transistor is formed in the substrate 502. Contrarily, with the first active region 504 of p-type dopant and the doped regions 506 of n-type dopant, an NMOS transistor is formed in the substrate 502. The doped regions 506 serve as drain or source of the NMOS transistor or the PMOS transistor.

Figure 5D:
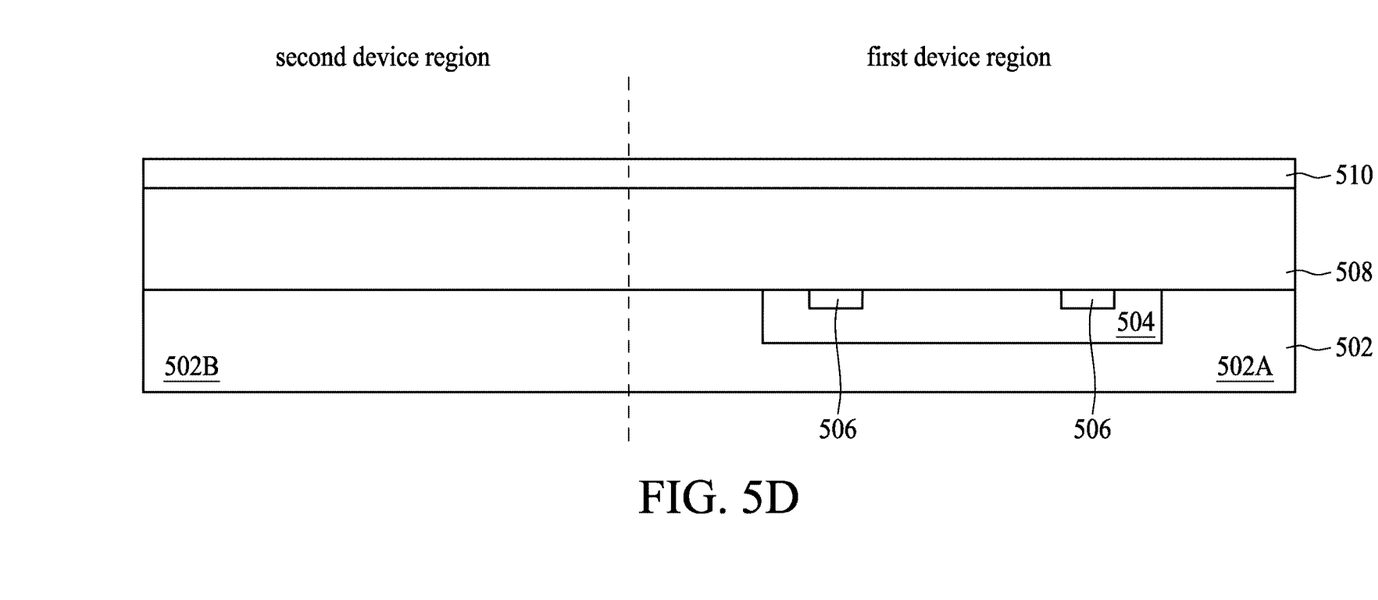

Referring to FIG. 5D, a first bandgap layer 508 is formed on the substrate 502 by, for example, a deposition operation. In addition, a second bandgap layer 510 is formed on the first bandgap layer 508 by, for example, a deposition operation. Bandgap of the second bandgap layer 510 is greater than that of the first bandgap layer 508. For example, the first bandgap layer 508 is made of a material of GaN, and the second bandgap layer 510 is made of a material of AlGaN.

Figure 5E:
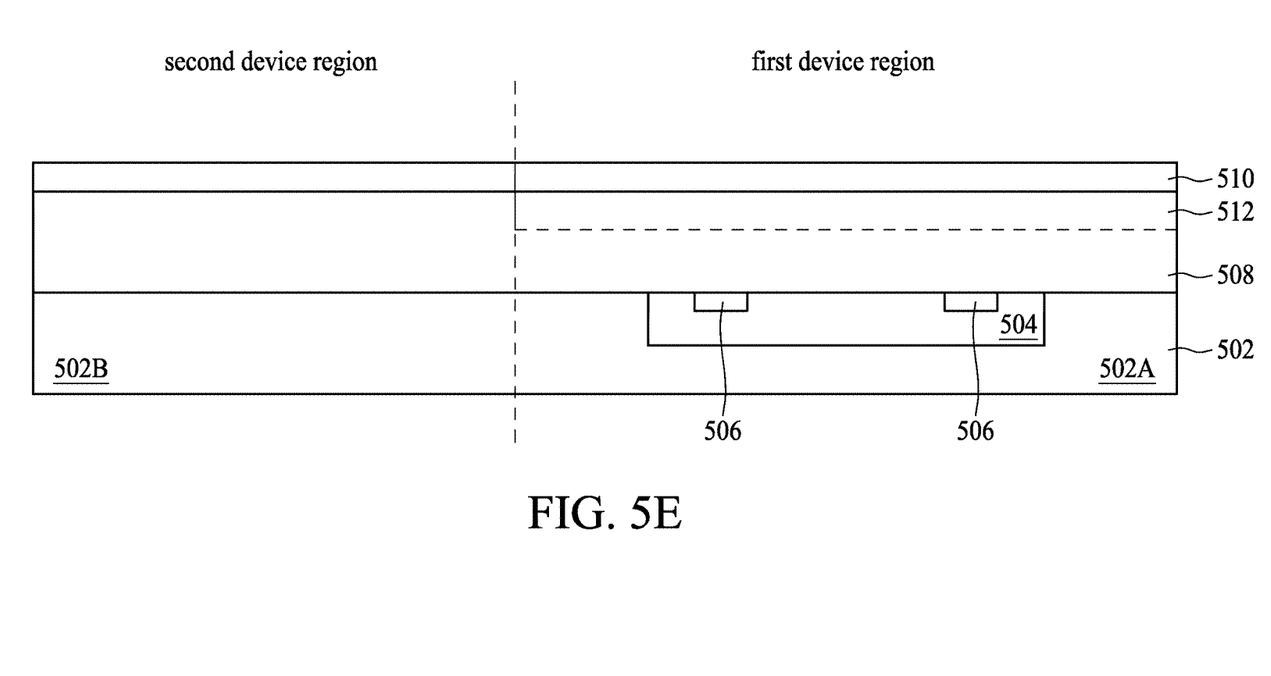

Referring to FIG. 5E, an isolation region 512 is formed in the first bandgap layer 508 and the second bandgap layer 510 by, for example, a an implantation operation, implanting negatively-charged ions in an exposed second bandgap layer 510 associated with the first device region 502A. Specifically, the isolation region 512 across an interface between the first bandgap layer 508 and the second bandgap layer 510 associated with the first device region.

Figure 5F:
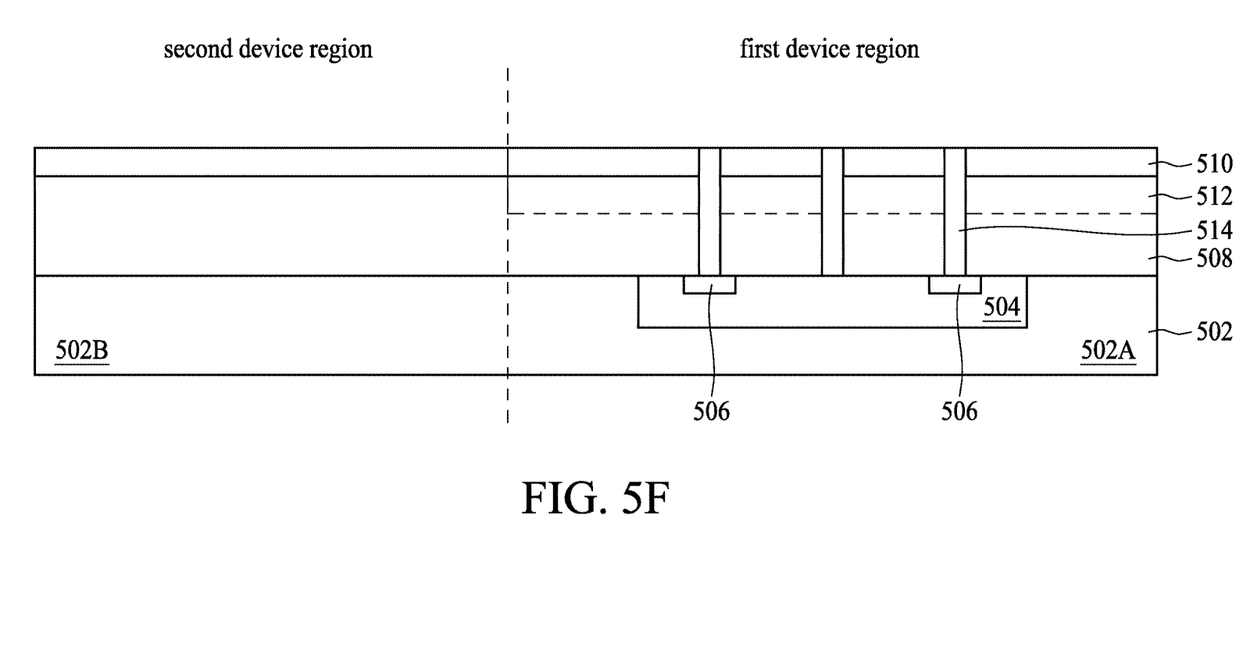

Referring to FIG. 5F, an interconnect 514 is formed in the first bandgap layer 508 and the second bandgap layer 510 by, for example, an etching operation, forming a via trench exposing the doped regions 506 and a portion of the first active region 504, and followed by a deposition operation, depositing conductive materials in the via trench to form the interconnect 514. For example, the interconnect 514 is a thorough-GaN-Via (TGV). A transistor defined by the first active region 504 and the doped regions 506 is communicatively coupled to another device via an interconnect 514.

Figure 5G:
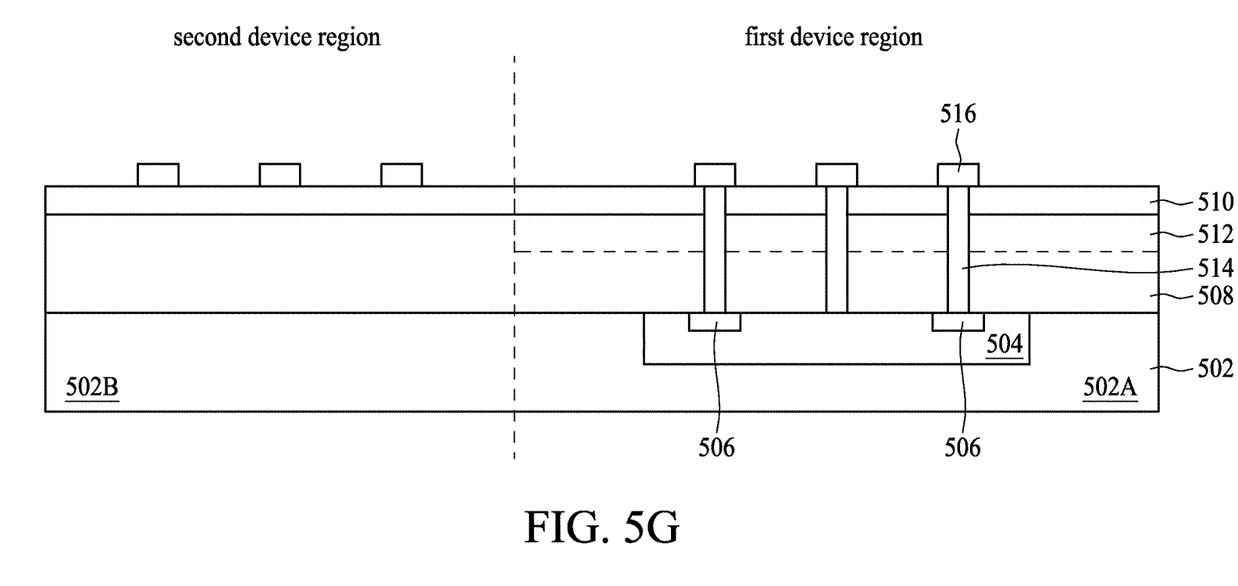

Referring to FIG. 5G, a patterned conductive layer 516 is formed on the second bandgap layer 510 by, for example, a deposition operation, followed by an etching operation. Note the patterned conductive layer 516 can be positioned on both the first device region 502A and the second device region 502B. In some embodiments, the patterned conductive layer 516 is a first metal layer after the front end operations.

In the present embodiment, a surface of the semiconductor structure is a surface of the second bandgap layer 510. Therefore, a surface of the first device (referring to a device at a right side of the dotted line and whose active region is defined by a first material system) is coplanar with a surface of the second device (referring to a device at a left side of the dotted line and whose active region is defined by the second material system). For similar reasons as provided in the embodiment of FIG. 1, the cost per area of the semiconductor structure is relatively low and manufacturing of the semiconductor structure becomes simpler due to no requirement of the bonding operation.

Figure 6:
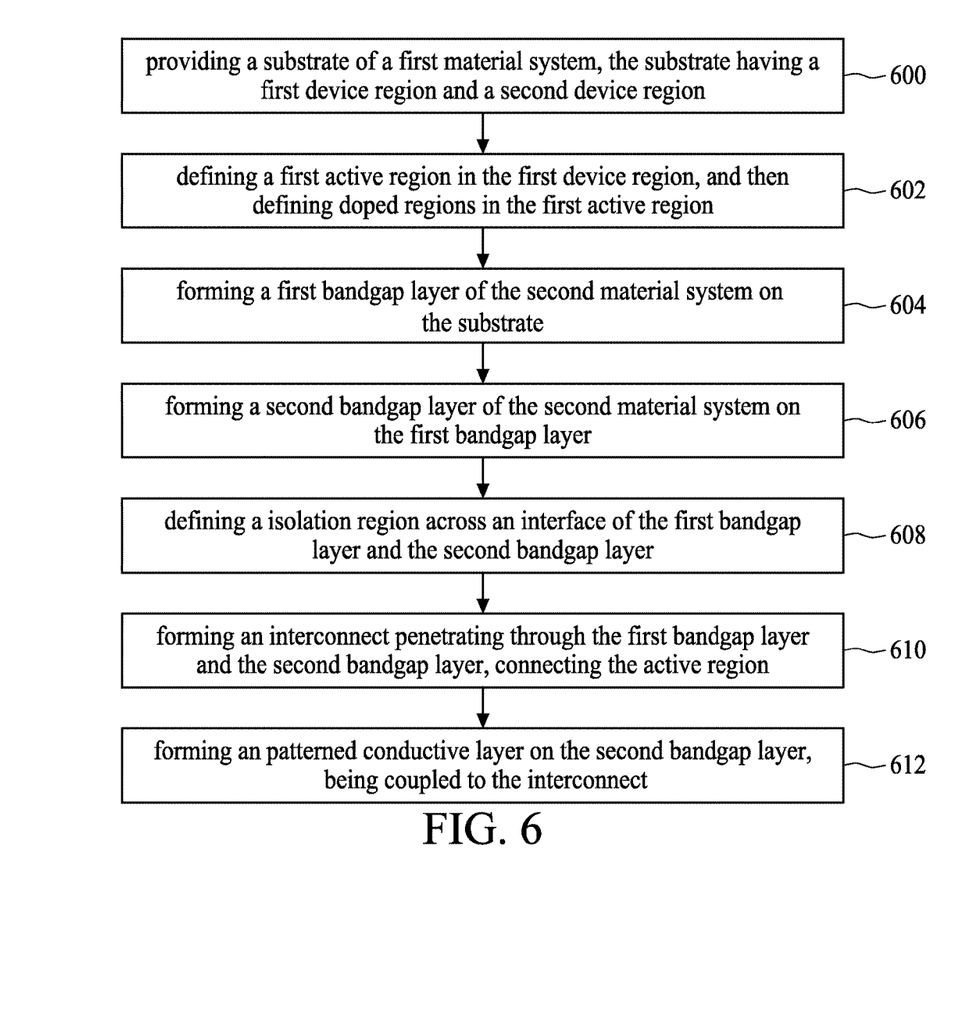
FIG. 6 is a flow diagram illustrating a method of forming a semiconductor structure, in accordance with some embodiments of the present disclosure.

FIG. 6 is a flow diagram illustrating a method of forming a semiconductor structure, in accordance with some embodiments of the present disclosure. Referring to FIG. 6, in operation 600, a substrate of a first material system is provided. The substrate includes a first device region and a second device region. The first device region and the second device region are associated with a first device and a second device, respectively. The substrate is similar to the substrate 14 or the substrate 502 described and illustrated with reference to FIGS. 4 and 5A, respectively. In addition, the first device region and the second device region are similar to the first device region 14A and the second device region 14B illustrated and described with reference to FIG. 3. In an embodiment, the substrate is a p-type substrate.

In operation 602, a first active region is defined in the first device region, and then doped regions are defined in the first active region. In an embodiment, the first active region is an n-well and the doped regions include a p-type dopant, resulting in a PMOS transistor. In another embodiment, the first active region is a p-well, and the doped regions include an n-type dopant.

In operation 604, a first bandgap layer of a second material system is formed on the substrate. The first bandgap layer is similar to the first bandgap layer 36 described and illustrated with reference to FIG. 3. The second material system is different from the first material system. For example, the first material system includes silicon while the second material system includes a III-V material, which may be gallium arsenide, indium arsenide, indium gallium arsenide, indium phosphide, gallium nitride, indium antimonide, gallium antimonide, gallium phosphide, and/or any ternary or quaternary compounds thereof or mixtures or alloys thereof. In the present embodiment, the first bandgap layer is a GaN layer.

In operation 606, a second bandgap layer of the second material system is formed on the first bandgap layer. The second band gap layer is similar to the second bandgap layer 38 described and illustrated with reference to FIG. 3. Bandgap of the second bandgap layer is greater than that of the first bandgap layer. In such a manner, a second active region is defined by an interface of the first bandgap layer and the second bandgap layer. In the present embodiment, the second bandgap layer is an AlGaN layer.

Subsequent to operation 606, in operation 608, an isolation region is defined at an interface between the first bandgap layer and the second bandgap layer. The isolation region is similar to the isolation region 27 described and illustrated with reference to FIG. 3. For similar reasons as provided in the embodiment of FIG. 2, the isolation region is configured to repel electrons coming from the second active region of the second device region 502B.

In operation 610, an interconnect is formed. The interconnect penetrates through the first bandgap layer and the second bandgap layer at the first device region 502A, and connects the first active region at one end, a conductive layer discussed later at the other end.

In operation 612, a patterned conductive layer is formed on the second bandgap layer and in connection with the interconnect. The patterned conductive layer is electrically coupled to the first active region via the interconnect.

Some embodiments have one or a combination of the following features and/or advantages. In some embodiments, a semiconductor structure includes a first device having a first surface and a second device having a second surface. The second surface is coplanar with the first surface. The first device includes a first active region defined by a first material system. The second device includes a second active region defined by a second material system. The second material system is different from the first material system.

In some embodiments, a semiconductor structure includes a silicon substrate and a III-V layer. The silicon substrate has an active region therein. The III-V layer is on the substrate and over the active region of the silicon substrate.

In some embodiments, a method for manufacturing a semiconductor structure includes at least the following operations. A substrate of a first material system is provided. The substrate has a first device region and a second device region. An active region in the first device region is defined. A layer of a second material system is formed on the substrate. The second material system is different from the first material system. An isolation region is defined in a portion of the layer over the first device region.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a first device having a first surface, the first device including:
   a first active region defined by a first material system; and
   a second device having a second surface, the second surface being coplanar with the first surface, the second device including:
   a second active region defined by a second material system, wherein the second material system is different from the first material system,
   wherein the first device and the second device further include a layer of the second material system, and the first surface and the second surface being a top surface of the layer of the second material system.

2. The semiconductor structure of claim 1, wherein the first material system includes Si, and the second material system includes a III-V material.

3. The semiconductor structure of claim 1, wherein the first device and the second device further includes a substrate, the substrate comprising a first device region associated with the first device and a second device region associated with the second device; the first active region being disposed in the first device region.

4. The semiconductor structure of claim 1, wherein the second active region being in the layer.

5. The semiconductor structure of claim 1, wherein the first device comprises an isolation region in the layer of the second material system and over the first active region.

6. The semiconductor structure of claim 5, wherein the isolation region has a first side and a second side opposite to the first side, and the first active region has a first side and a second side opposite to the first side, wherein a first distance between the first side and the second side of the isolation region is greater than a second distance between the first side and the second side of the first active region.

7. The semiconductor structure of claim 6, wherein a difference of the first distance to the second distance is less than 10 µm.

8. The semiconductor structure of claim 1, wherein the layer comprises a first bandgap layer and a second bandgap layer on the first band gap layer, bandgap of the second bandgap layer being greater than that of the first bandgap layer.

9. The semiconductor structure of claim 8, wherein the first device comprises an isolation region over the first device region and across an interface between the first bandgap layer and the second bandgap layer.

10. The semiconductor structure of claim 1, further comprising a patterned conductive layer on the layer of the second material system, wherein the first device further comprises an interconnect penetrating through the layer, and connecting the patterned conductive layer and the first active region.

11. A semiconductor structure, comprising:
a silicon substrate having an active region therein; and
a III-V layer on the substrate and over the active region of the silicon substrate.

12. The semiconductor structure of claim 11, wherein the III-V layer includes:
a first bandgap layer on the substrate; and
a second bandgap layer on the first bandgap layer, wherein bandgap of the bandgap layer is greater than that of the first bandgap layer.

13. The semiconductor structure of claim 12, further comprising:
an isolation region across an interface between the first bandgap layer and the bandgap layer.

14. The semiconductor structure of claim 13, wherein the isolation comprises a first side and a second side opposite to the first side, and the active comprises a first side and a second side opposite to the first side, wherein a between the first side and the second side of the isolation region is greater than between the first side and the second side of the active region.

15. The semiconductor structure of claim 11, comprising:
a patterned conductive layer on the III-V layer; and
an interconnect penetrating through the III-V layer, and connecting the conductive layer and the active region.

16. A semiconductor structure, comprising:
a silicon substrate having a first active region in a first device region of the silicon substrate; and
a III-V layer having a second active region therein, wherein the III-V layer is on the silicon substrate, and over the first active region of the silicon substrate, wherein the second active region is over a second device region of the silicon substrate, wherein the second device region is immediately adjacent to the first device region.

17. The semiconductor structure of claim 16, wherein the III-V layer includes:
a first bandgap layer on the silicon substrate; and
a second bandgap layer on the first bandgap layer, wherein bandgap of the second bandgap layer is greater than that of the first bandgap layer.

18. The semiconductor structure of claim 17, further comprising:
an isolation region across an interface between the first bandgap layer and the second bandgap layer.

19. The semiconductor structure of claim 16, further comprising:
a patterned conductive layer on the III-V layer; and
an interconnect penetrating through the III-V layer, and connecting the patterned conductive layer and the first active region.

* * * * *